United States Patent
Volkovich et al.

(10) Patent No.: US 11,355,375 B2
(45) Date of Patent: Jun. 7, 2022

(54) DEVICE-LIKE OVERLAY METROLOGY TARGETS DISPLAYING MOIRÉ EFFECTS

(71) Applicant: KLA Corporation, Milpitas, CA (US)

(72) Inventors: Roie Volkovich, Hadera (IL); Liran Yerushalmi, Zircon Yaacob (IL); Raviv Yohanan, Qiryat Motzkin (IL); Mark Ghinovker, Yoqneam Ilit (IL)

(73) Assignee: KLA Corporation, Milpitas, CA (US)

( * ) Notice: Subject to any disclaimer, the term of this patent is extended or adjusted under 35 U.S.C. 154(b) by 3 days.

(21) Appl. No.: 16/931,078

(22) Filed: Jul. 16, 2020

(65) Prior Publication Data

US 2022/0020625 A1   Jan. 20, 2022

Related U.S. Application Data

(60) Provisional application No. 63/049,637, filed on Jul. 9, 2020.

(51) Int. Cl.
*H01L 21/68* (2006.01)
*G01B 11/27* (2006.01)
*G03F 7/20* (2006.01)

(52) U.S. Cl.
CPC .......... *H01L 21/682* (2013.01); *G01B 11/272* (2013.01); *G03F 7/70633* (2013.01)

(58) Field of Classification Search
CPC .................................................. H01L 21/682
USPC ........................................................ 356/620
See application file for complete search history.

(56) References Cited

U.S. PATENT DOCUMENTS

| | | | | |
|---|---|---|---|---|
| 4,929,083 | A | * | 5/1990 | Brunner ............. G03F 7/70591 356/123 |
| 5,767,959 | A | * | 6/1998 | Kobayashi ......... G01M 11/0264 356/124 |
| 6,275,621 | B1 | | 8/2001 | Terry |
| 6,921,916 | B2 | | 7/2005 | Adel et al. |
| 6,982,793 | B1 | * | 1/2006 | Yang ................... G03F 7/70633 356/401 |
| 7,068,833 | B1 | | 6/2006 | Ghinovker et al. |
| 7,177,457 | B2 | | 2/2007 | Adel et al. |
| 7,349,105 | B2 | | 3/2008 | Weiss |
| 7,440,105 | B2 | | 10/2008 | Adel et al. |
| 7,561,282 | B1 | | 7/2009 | Widmann |
| 9,182,219 | B1 | | 11/2015 | Manassen et al. |

(Continued)

FOREIGN PATENT DOCUMENTS

CN          107076682 A  *  8/2017   ........... G01N 23/207

OTHER PUBLICATIONS

PCT International Search Report and Written Opinion for International Application No. PCT/US2021/039742 dated Oct. 26, 2021, 6 pages.

*Primary Examiner* — Tarifur R Chowdhury
*Assistant Examiner* — Omar H Nixon
(74) *Attorney, Agent, or Firm* — Suiter Swantz pc llo

(57) ABSTRACT

A metrology system and metrology methods are disclosed. The metrology system comprises a set of device features on a first layer of a sample, a first set of target features on a second layer of the sample and overlapping the set of device features, and a second set of target features on the second layer of the sample and overlapping the set of device features. Relative positions of a first set of Moiré fringes and a second set of Moiré fringes indicate overlay error between the first layer of the sample and the second layer of the sample.

21 Claims, 8 Drawing Sheets

(56) References Cited

U.S. PATENT DOCUMENTS

| | | | |
|---|---|---|---|
| 2002/0158193 A1 | 10/2002 | Sezginer et al. | |
| 2018/0024054 A1 | 1/2018 | Moon et al. | |
| 2018/0136569 A1* | 5/2018 | Bangar | G03F 7/70633 |
| 2018/0188663 A1 | 7/2018 | Levinski et al. | |
| 2019/0004439 A1* | 1/2019 | Lubashevsky | G01N 21/9501 |
| 2019/0187564 A1* | 6/2019 | Samaniego | G01M 11/0264 |
| 2019/0219931 A1* | 7/2019 | Zwier | G03F 9/7049 |

\* cited by examiner

DEVICE-LIKE OVERLAY METROLOGY TARGETS DISPLAYING MOIRÉ EFFECTS

CROSS-REFERENCE TO RELATED APPLICATION

The present application claims the benefit under 35 U.S.C. § 119(e) of U.S. Provisional Application Ser. No. 63/049,637, filed Jul. 9, 2020, entitled DEVICE LIKE TARGETS WITH MOIRE EFFECT, naming Roie Volkovich, Liran Yerushalmi, Raviv Yohanan, and Mark Ghinovker as inventors, which is incorporated herein by reference in the entirety.

TECHNICAL FIELD

The present disclosure relates generally to imaging overlay metrology and, more particularly, to imaging overlay targets with Moiré elements.

BACKGROUND

Shrinking design rules and more demanding specifications for overlay metrology are driving increased demands for the sensitivity and robustness of overlay metrology methods. Overlay metrology is typically performed by fabricating dedicated metrology targets having fabricated features in multiple sample layers of interest. Accordingly, an analysis of a fabricated metrology target may provide a measurement of the overlay error (e.g., relative alignment error) between the sample layers of interest. While a wide variety of overlay metrology target designs have been proposed, there is a continuous need to improve the metrology target designs as well as measurement methods for accurately and efficiently analyzing fabricated metrology targets.

SUMMARY

An overlay metrology target is disclosed in accordance with one or more illustrative embodiments of the present disclosure. In one illustrative embodiment, the overlay metrology target comprises a set of device features on a first layer of a sample. At least a portion of the set of device features is periodic with a device period. In another illustrative embodiment, the overlay metrology target comprises a first set of target features on a second layer of the sample and overlapping the set of device features. The first set of target features is periodic with a first measurement period, and the first measurement period is selected to provide a first set of Moiré fringes visible by a detector when the target is imaged by the detector. In another illustrative embodiment, the overlay metrology target comprises a second set of target features on the second layer of the sample and overlapping the set of device features. The second set of target features is periodic with a second measurement period, and the second measurement period is selected to provide a second set of Moiré fringes visible by the detector when the target is imaged by the detector. In another illustrative embodiment, relative positions of the first set of Moiré fringes and the second set of Moiré fringes are indicative of overlay error between the first layer of the sample and the second layer of the sample.

An overlay metrology system is disclosed in accordance with one or more illustrative embodiments of the present disclosure. In one illustrative embodiment, the overlay metrology system comprises an illumination source to illuminate a sample. The sample includes an overlay target comprising a set of device features on a first layer of the sample, wherein at least a portion of the set of device features is periodic with a device period. The sample further includes a first set of target features on a second layer of the sample and overlapping the set of device features, wherein the first set of target features is periodic with a first measurement period. The sample further includes a second set of target features on the second layer of the sample and overlapping the set of device features, wherein the second set of target features is periodic with a second measurement period. In another illustrative embodiment, the overlay metrology system comprises a detector configured to image the overlay target when illuminated by the illumination source, wherein the first measurement period is selected to provide a first set of Moiré fringes visible by the detector when the target is imaged by the detector, and the second measurement period is selected to provide a second set of Moiré fringes visible by the detector when the target is imaged by the detector. In another illustrative embodiment, the overlay metrology system comprises a controller communicatively coupled with the detector. The controller includes one or more processors configured to execute program instructions causing the one or more processors to receive an image of the overlay target, measure relative positions of the first Moire fringe and the second Moire fringe in the image as an apparent overlay error, and determine an overlay error between the first layer of the sample and the second layer of the sample by adjusting the apparent overlay error by Moire gain factors associated with the device period, the first measurement period, and the second measurement period.

An overlay metrology method is disclosed in accordance with one or more illustrative embodiments of the present disclosure. In one illustrative embodiment, the overlay metrology method comprises fabricating a set of device features on a first layer of a sample, wherein at least a portion of the set of device features is periodic with a device period. In another illustrative embodiment, the overlay metrology method comprises fabricating a first set of target features on a second layer of the sample and overlapping the set of device features. The first set of target features is periodic with a first measurement period, and the first measurement period is selected to provide a first set of Moiré fringes visible by a detector when the target is imaged by the detector. In another illustrative embodiment, the overlay metrology method comprises fabricating a second set of target features on the second layer of the sample and overlapping the set of device features. The second set of target features is periodic with a second measurement period, and the second measurement period is selected to provide a second set of Moiré fringes visible by the detector when the target is imaged by the detector.

An overlay metrology method is disclosed in accordance with one or more illustrative embodiments of the present disclosure. In one illustrative embodiment, the overlay metrology method comprises illuminating a sample using an illumination source. The sample includes an overlay target comprising a set of device features on a first layer of the sample, wherein at least a portion of the set of device features is periodic with a device period, a first set of target features on a second layer of the sample and overlapping the set of device features, wherein the first set of target features is periodic with a first measurement period, and a second set of target features on the second layer of the sample and overlapping the set of device features, wherein the second set of target features is periodic with a second measurement period. In another illustrative embodiment, the overlay metrology method comprises imaging the overlay target using a detector, wherein the first measurement period is selected to provide a first set of Moiré fringes visible by the detector when the target is imaged by the detector, and the second measurement period is selected to provide a second set of Moiré fringes visible by the detector when the target is imaged by the detector. In another illustrative embodiment, the overlay metrology method comprises, using a controller communicatively coupled with the detector, (1) receiving an image of the overlay target, (2) measuring relative positions of the first Moiré fringe and the second Moiré fringe in the image as an apparent overlay error, and (3) determining an overlay error between the first layer of the sample and the second layer of the sample by adjusting the apparent overlay error by Moiré gain factors associated with the device period, the first measurement period, and the second measurement period.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1:
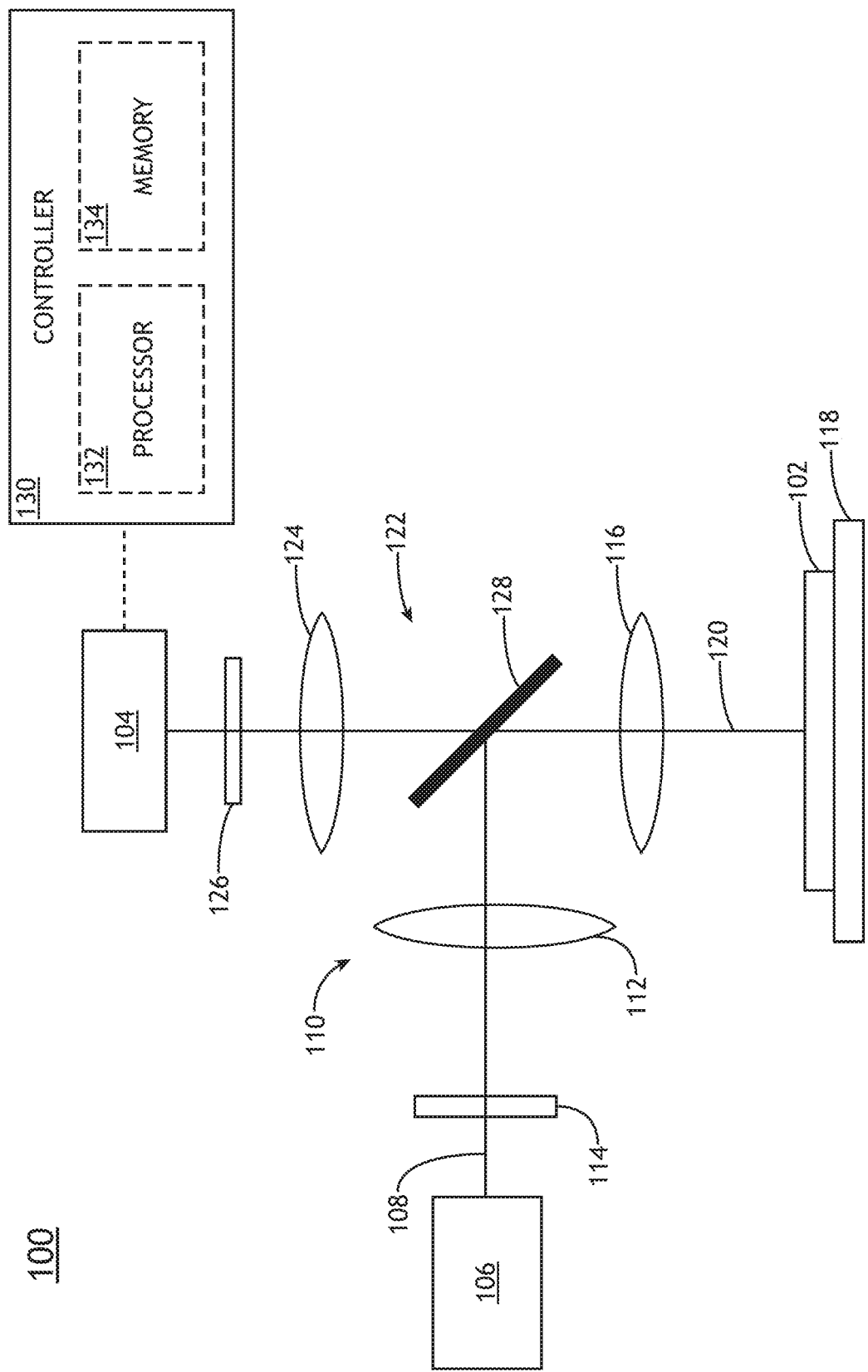
FIG. 1 is a block diagram view of a metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting.

In conventional overlay metrology methods, metrology targets are expected to reproduce device (e.g., DRAM, SRAM, CPU, etc.) behavior and provide accurate overlay measurements corresponding to the actual overlay of the device. Such conventional targets may include AIM™, rAIM™, and tAIM Targets™ (trademarks of KLA Corporation). In these conventional targets, there are no structures corresponding to actual device patterns. This absence of device structures reduces the correlation between the conventional targets and the device, and impacts the overlay accuracy provided by the metrology targets.

The present disclosure is directed to overlay metrology targets that use actual device patterns (e.g., DRAM or SRAM layers) and the Moiré effect to improve metrology overlay accuracy. The present disclosure advantageously reduces device-to-target error by measuring actual device structures to eliminate non-scanner error. Additionally, embodiments of the present disclosure may enable the measurement of the device instead of a conventional metrology target. This device measurement may be performed by taking a regular production wafer and running a reticle with a top layer being a Moiré pattern layer. After overlay measurement, the wafers may be reworked to leave only scanner error (~0.7 nanometers on-product overlay [OPO]).

A Moiré pattern on a metrology target may include a grating-over-grating structure formed from grating structures on different sample layers with different periods. For the purposes of this disclosure, a "grating" or a "grating structure" may describe any periodic structure or series of elements that may include, but is not limited to, line/space patterns. An image of the Moiré pattern will include Moiré fringes at a Moiré pitch, which is associated with spatially-varying overlap between the gratings on the different sample layers. The Moiré pitch is typically a longer pitch than either of the grating structures and is related to the difference between the pitches of the grating structures. For example, the Moiré pitch ($p_M$) may be characterized as:

$$p_M = \frac{p_1 \cdot p_2}{p_1 - p_2} \qquad (1)$$

where $p_1$ is the period of a first grating structure on a first layer, $p_2$ is the period of the second grating structure on the second layer.

It is contemplated herein that metrology targets including Moiré patterns may facilitate sensitive overlay measurements. In particular, a physical shift of one grating with respect to another grating in a Moiré pattern (e.g., an overlay error associated with a relative shift of two sample layers on a sample) along a direction of periodicity will result in a corresponding lateral shift of the Moiré fringes along the measurement direction. Further, the magnitude of the shift of the Moiré fringes is typically greater than the magnitude of the physical shift. In particular, the magnitude of the shift of the Moiré fringes is proportional to the physical shift (e.g., the overlay error) by a conditional Moiré factor, which depends on the frame of reference. Continuing the example above, a shift of the second layer with respect to the first layer will result in a shift of the Moiré fringes from a nominal position (e.g., no overlay error) by a conditional Moiré factor (M) of:

$$M = \frac{p_1}{p_1 - p_2}. \qquad (2)$$

However, in the context of the present disclosure, references to "first layer," "second layer," "third layer," or the like are intended merely to distinguish various sample layers and do not indicate a physical ordering of layers on the sample. Accordingly, a "first layer" may be above or below a "second layer" on the sample.

In this regard, an overlay measurement may be performed by measuring a shift of the Moiré fringes along the direction of periodicity of the associated grating structures on a metrology target and adjusting this value by a Moiré gain, which will depend on the particular design of the metrology target and the particular measurements made. For example, it may be desirable to measure a shift of Moiré fringes relative to another structure or another set of Moiré fringes since an absolute measurement of a single Moiré fringe shift may be difficult, impractical, or impossible for some target designs. The use of Moiré patterns in overlay metrology is generally described in U.S. Pat. No. 7,440,105 issued on Oct. 21, 2008, U.S. Pat. No. 7,349,105 issued on Mar. 25, 2008, and U.S. Patent Appl. Publ. No. 2018/0188663 published on Jul. 5, 2018, all of which are incorporated herein in their entirety.

It is further recognized herein that arranging elements of a metrology target in a symmetric configuration may facilitate the determination of relative positions of the elements based on exploitation of the symmetry. For example, an overlay metrology target may be formed such that a center of symmetry of elements on a first sample layer overlaps a center of symmetry of elements on a second sample layer. Accordingly, any difference between the centers of symmetry for elements in the first layer with respect to the second layer in a fabricated metrology target may be attributed to overlay error. The exploitation of symmetry in overlay metrology targets (e.g., Advanced Imaging Metrology (AIM) targets) is described generally in U.S. Pat. No. 7,068,833 issued on Jun. 27, 2006, U.S. Pat. No. 6,921,916 issued on Jul. 26, 2005, and U.S. Pat. No. 7,177,457 issued on Feb. 13, 2007, all of which are incorporated herein by reference in their entirety.

Embodiments of the present disclosure may be directed to overlay metrology targets having at least one working zone with one or more Moiré patterns arranged in a symmetric distribution. For example, the Moiré patterns within the working zone may be distributed in a mirror symmetric distribution or a rotationally symmetric distribution (e.g., a 90° rotationally-symmetric distribution, a 180° rotationally-symmetric distribution, or the like). In this regard, advantages of Moiré patterns and advantages of symmetry in metrology targets may be combined and exploited together to facilitate accurate and robust overlay metrology.

It is recognized herein that the impact of a physical overlay error on a working group including one or more instances of a Moiré pattern may be to shift a center of symmetry based on a shift of Moiré fringes as described previously herein. Accordingly, any measurement of overlay based on the center of symmetry must be adjusted based on a Moiré gain factor. It is further recognized herein that the Moiré gain factor may depend on the particular arrangement of elements in an overlay metrology target.

FIG. 1 is a block diagram view of a metrology system 100, in accordance with one or more embodiments of the present disclosure. The metrology system 100 may generate one or more images of a sample 102 on at least one detector 104 using any method known in the art.

In one embodiment, the metrology system 100 includes an illumination source 106 to generate an illumination beam 108. The illumination beam 108 may include one or more selected wavelengths of light including, but not limited to, vacuum ultraviolet radiation (VUV), deep ultraviolet radiation (DUV), ultraviolet (UV) radiation, visible radiation, or infrared (IR) radiation. The illumination source 106 may further generate an illumination beam 108 including any range of selected wavelengths. In another embodiment, the illumination source 106 may include a spectrally-tunable illumination source to generate an illumination beam 108 having a tunable spectrum.

The illumination source 106 may further produce an illumination beam 108 having any temporal profile. For example, the illumination source 106 may produce a continuous illumination beam 108, a pulsed illumination beam 108, or a modulated illumination beam 108. Additionally, the illumination beam 108 may be delivered from the illumination source 106 via free-space propagation or guided light (e.g. an optical fiber, a light pipe, or the like). In some embodiments, the illumination beam 108 may comprise incoherent light. In other embodiments, the illumination beam 108 may comprise coherent light.

In another embodiment, the illumination source 106 directs the illumination beam 108 to a sample 102 via an illumination pathway 110. The illumination pathway 110 may include one or more lenses 112 or additional illumination optical components 114 suitable for modifying and/or conditioning the illumination beam 108. For example, the one or more illumination optical components 114 may include, but are not limited to, one or more polarizers, one or more filters, one or more beam splitters, one or more diffusers, one or more homogenizers, one or more apodizers, one or more beam shapers, or one or more shutters (e.g., mechanical shutters, electro-optical shutters, acousto-optical shutters, or the like). By way of another example, the one or more illumination optical components 114 may include aperture stops to control the angle of illumination on the sample 102 and/or field stops to control the spatial extent of illumination on the sample 102. In one instance, the illumination pathway 110 includes an aperture stop located at a plane conjugate to the back focal plane of the objective lens 116 to provide telecentric illumination of the sample. In another embodiment, the metrology system 100 includes an objective lens 116 to focus the illumination beam 108 onto the sample 102.

In another embodiment, the sample 102 is disposed on a sample stage 118. The sample stage 118 may include any device suitable for positioning the sample 102 within the metrology system 100. For example, the sample stage 118 may include any combination of linear translation stages, rotational stages, tip/tilt stages or the like.

In another embodiment, a detector 104 is configured to capture radiation emanating from the sample 102 (e.g., sample light 120) through a collection pathway 122. For example, the collection pathway 122 may include, but is not required to include, a collection lens (e.g. the objective lens 116 as illustrated in FIG. 1) or one or more additional collection pathway lenses 124. In this regard, a detector 104 may receive radiation reflected or scattered (e.g. via specular reflection, diffuse reflection, and the like) from the sample 102 or generated by the sample 102 (e.g. luminescence associated with absorption of the illumination beam 108, or the like).

The collection pathway 122 may further include any number of collection optical components 126 to direct and/or modify illumination collected by the objective lens 116 including, but not limited to one or more collection pathway lenses 124, one or more filters, one or more polarizers, or one or more beam blocks. Additionally, the collection pathway 122 may include field stops to control the spatial extent of the sample imaged onto the detector 104 or aperture stops to control the angular extent of illumination from the sample used to generate an image on the detector 104. In another embodiment, the collection pathway 122 includes an aperture stop located in a plane conjugate to the back focal plane of an optical element the objective lens 116 to provide telecentric imaging of the sample.

The detector 104 may include any type of optical detector known in the art suitable for measuring illumination received from the sample 102. For example, a detector 104 may include a sensor suitable for generating one or more images of a static sample 102 (e.g., in a static mode of operation) such as, but is not limited to, a charge-coupled device (CCD), a complementary metal-oxide-semiconductor (CMOS) sensor, a photomultiplier tube (PMT) array, or an avalanche photodiode (APD) array. Further, the detector 104 may include a multi-tap sensor having two or more taps per pixel including, but not limited to, a multi-tap CMOS sensor. In this regard, charge in a multi-tap pixel may be directed to any selected tap during an exposure window based on one or more drive signals to the pixel. Accordingly, a multi-tap sensor including an array of multi-tap pixels may generate multiple images, each associated with different taps of the associated pixels, during a single readout phase. Further, for the purposes of the present disclosure, a tap of a multi-tap sensor may refer to an output tap connected to the associated pixels. In this regard, reading out each tap of a multi-tap sensor (e.g., in a readout phase) may generate a separate image.

By way of another example, a detector 104 may include a sensor suitable for generating one or more images of a sample 102 in motion (e.g., a scanning mode of operation). For instance, the detector 104 may include a line sensor including a row of pixels. In this regard, the metrology system 100 may generate a continuous image (e.g., a strip image) one row at a time by translating the sample 102 in a scan direction perpendicular to the pixel row through a measurement field of view and continuously clocking the line sensor during a continuous exposure window.

In another instance, the detector 104 may include a TDI sensor including multiple pixel rows and a readout row. The TDI sensor may operate in a similar manner as the line sensor, except that clocking signals may successively move charge from one pixel row to the next until the charge reaches the readout row, where a row of the image is generated. By synchronizing the charge transfer (e.g., based on the clocking signals) to the motion of the sample along the scan direction, charge may continue to build up across the pixel rows to provide a relatively higher signal to noise ratio compared to the line sensor.

In another embodiment, a detector 104 may include a spectroscopic detector suitable for identifying wavelengths of radiation emanating from the sample 102. In another embodiment, the metrology system 100 may include multiple detectors 104 (e.g. associated with multiple beam paths generated by one or more beamsplitters to facilitate multiple metrology measurements by the metrology system 100. For example, the metrology system 100 may include one or more detectors 104 suitable for static mode imaging and one or more detectors 104 suitable for scanning mode imaging. In another embodiment, the metrology system 100 may include one or more detectors 104 suitable for both static and scanning imaging modes.

In one embodiment, as illustrated in FIG. 1, the metrology system 100 includes a beamsplitter 128 oriented such that the objective lens 116 may simultaneously direct the illumination beam 108 to the sample 102 and collect radiation emanating from the sample 102.

In another embodiment, the angle of incidence of the illumination beam 108 on the sample 102 is adjustable. For example, the path of the illumination beam 108 through the beamsplitter 128 and the objective lens 116 may be adjusted to control the angle of incidence of the illumination beam 108 on the sample 102. In this regard, the illumination beam 108 may have a nominal path through the beamsplitter 128 and the objective lens 116 such that the illumination beam 108 has a normal incidence angle on the sample 102. By way of another example, the angle of incidence of the illumination beam 108 on the sample 102 may be controlled by modifying the position and/or angle of the illumination beam 108 on the beamsplitter 128 (e.g. by rotatable mirrors, a spatial light modulator, a free-form illumination source, or the like). In another embodiment, the illumination source 106 directs the one or more illumination beam 108 to the sample 102 at an angle (e.g. a glancing angle, a 45-degree angle, or the like).

In another embodiment, the metrology system 100 includes a controller 130. In another embodiment, the controller 130 includes one or more processors 132 configured to execute program instructions maintained on a memory medium 134. In this regard, the one or more processors 132 of controller 130 may execute any of the various process steps described throughout the present disclosure. Further, the controller 130 may be configured to receive data including, but not limited to, images of the sample 102 from the detector 104.

The one or more processors 132 of a controller 130 may include any processing element known in the art. In this sense, the one or more processors 132 may include any microprocessor-type device configured to execute algorithms and/or instructions. In one embodiment, the one or more processors 132 may consist of a desktop computer, mainframe computer system, workstation, image computer, parallel processor, or any other computer system (e.g., networked computer) configured to execute a program configured to operate the metrology system 100, as described throughout the present disclosure. It is further recognized that the term "processor" may be broadly defined to encompass any device having one or more processing elements, which execute program instructions from a non-transitory memory medium 134. Further, the steps described throughout the present disclosure may be carried out by a single controller 130 or, alternatively, multiple controllers. Additionally, the controller 130 may include one or more controllers housed in a common housing or within multiple housings. In this way, any controller or combination of controllers may be separately packaged as a module suitable for integration into metrology system 100. Further, the controller 130 may analyze data received from the detector 104 and feed the data to additional components within the metrology system 100 or external to the metrology system 100.

The memory medium 134 may include any storage medium known in the art suitable for storing program instructions executable by the associated one or more processors 132. For example, the memory medium 134 may include a non-transitory memory medium. By way of another example, the memory medium 134 may include, but is not limited to, a read-only memory, a random access memory, a magnetic or optical memory device (e.g., disk), a magnetic tape, a solid state drive and the like. It is further noted that memory medium 134 may be housed in a common controller housing with the one or more processors 132.

In one embodiment, the memory medium 134 may be located remotely with respect to the physical location of the one or more processors 132 and controller 130. For instance, the one or more processors 132 of controller 130 may access a remote memory (e.g., server), accessible through a network (e.g., internet, intranet and the like). Therefore, the above description should not be interpreted as a limitation on the present invention but merely an illustration.

In another embodiment, the controller 130 is communicatively coupled to one or more elements of the metrology system 100. In this regard, the controller 130 may transmit and/or receive data from any component of the metrology system 100. Further, the controller 130 may direct or otherwise control any component of the metrology system 100 by generating one or more drive signals for the associated components. For example, the controller 130 may be communicatively coupled to the detector 104 to receive one or more images from the detector 104.

Further, the controller 130 may provide one or more drive signals to the detector 104 to carry out any of the detection techniques described herein. By way of another example, the controller 130 may be communicatively coupled to any combination of components to control the optical configuration associated with an image including, but not limited to, the illumination source 106, the illumination optical components 114, the collection optical components 126, the detector 104, or the like.

Figure 2A:
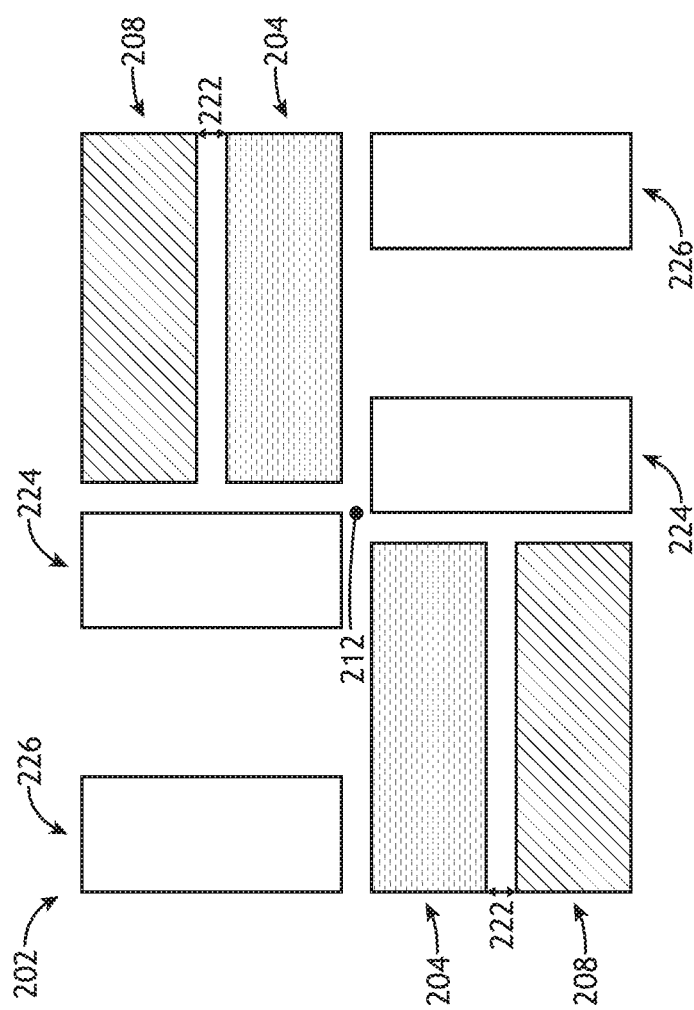
FIG. 2A is a top plan view of a metrology target having Moiré patterns based on grating-over-grating structures in multiple rotationally-symmetric working zones, in accordance with one or more embodiments of the present disclosure.
Figure 2B:
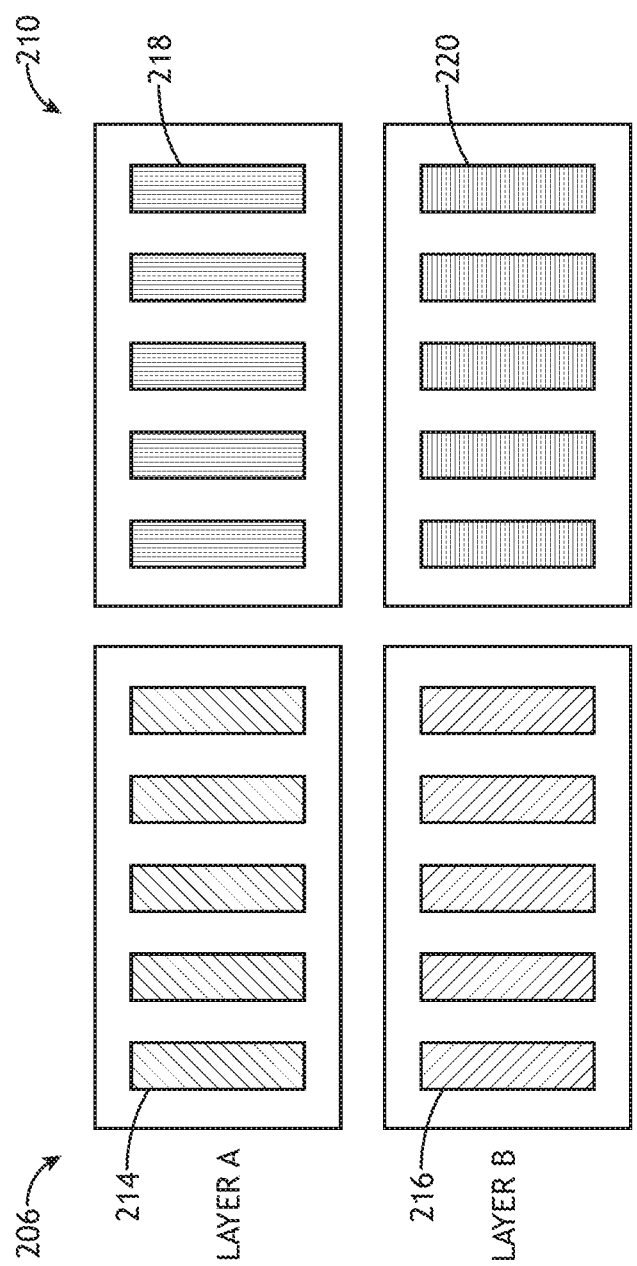
FIG. 2B is a top plan view of multi-layer grating structures in the Moiré patterns of FIG. 2A, in accordance with one or more embodiments of the present disclosure.

FIG. 2A is a top plan view of a metrology target 202 having Moiré patterns based on grating-over-grating structures in multiple rotationally-symmetric working zones. FIG. 2B is a conceptual view of multi-layer grating structures in the Moiré patterns of FIG. 2A.

A metrology target 202 may include a first working zone 204 formed from two instances of a first Moiré pattern 206 arranged such that the first working zone 204 is rotationally symmetric. In another embodiment, the metrology target 202 includes a second working zone 208 formed from two instances of a second Moiré pattern 210 arranged such that the second working zone 208 is rotationally symmetric. In the context of the present disclosure, a working zone is a group of features that are intended to be analyzed together. For example, an overlay measurement may be performed by comparing characteristics of one working zone to another.

As illustrated in FIG. 2A, which depicts a situation with no overlay error, the first working zone 204 and the second working zone 208 are symmetric to 180° rotation about a center of symmetry 212.

The metrology target 202 in FIG. 2A may have similar rotational symmetry characteristics as an Advanced Imaging Metrology (AIM) target, which is generally described in U.S. Pat. No. 7,068,833 issued on Jun. 27, 2006, U.S. Pat. No. 6,921,916 issued on Jul. 26, 2005, and U.S. Pat. No. 7,177,457 issued on Feb. 13, 2007. However, whereas each working zone in a typical AIM target include features in a single layer, at least one working zone of the metrology target 202 (e.g., the first working zone 204 and second working zone 208) includes a Moiré pattern formed from grating structures in multiple layers of interest. As illustrated in FIG. 2B, the first Moiré pattern 206 is formed from a first grating structure 214 having a pitch Q in a first layer (layer A) and a second grating structure 216 having a pitch P in a second layer (layer B), where P≠Q. Further, the second Moiré pattern 210 is formed from a third grating structure 218 having a pitch T in the first layer (layer A) and a fourth grating structure 220 having a pitch S in the second layer (layer B), where S≠T. In a general sense, the values of P, Q, S, and T may be independently varied such that FIGS. 2A and 2B represents a generic Moiré AIM target.

As described previously herein with respect to equations (1) and (2), the first working zone 204 will then have a Moiré pitch ($p_{M1}$) of $$p_{M1} = \frac{QP}{Q-P} \qquad (3)$$

and the second working zone 208 will have a Moiré pitch ($p_{M2}$) of $$p_{M2} = \frac{ST}{S-T}. \qquad (4)$$

The first working zone 204 will then have a conditional Moiré factor ($M_1$) of $$M_1 = \frac{P}{P-Q} \qquad (5)$$

associated with a misalignment of layer A with respect to layer B, and the second working zone 208 will have a conditional Moiré factor ($M_2$) of $$M_2 = \frac{S}{S-T}. \qquad (6)$$

associated with a shift of layer A with respect to layer B. Similarly, a shift of layer B with respect to layer A would provide $$M_1 = \frac{Q}{Q-P} \text{ and } M_2 = \frac{T}{T-S}.$$

In one embodiment, the first Moiré pattern 206 and/or the second Moiré pattern 210 include a grating-over-grating structure in which the respective gratings are fully overlapping. For example, the first grating structure 214 and the second grating structure 216 of the first Moiré pattern 206 may be fully overlapping on the sample 102. Similarly, the third grating structure 218 and the fourth grating structure 220 of the second Moiré pattern 210 may be fully overlapping on the sample 102. In this regard, the size of the metrology target 202 may be minimized to efficiently utilize space on the sample 102.

A metrology target 202 including adjacent Moiré patterns may be susceptible to cross-talk. Further, the severity of cross-talk may depend on several factors including, but not limited to, the stack thicknesses, material properties, grating design, or conditions of a measurement system (e.g., metrology system 100). The metrology target 202 includes exclusion zones between working zones, or Moiré patterns associated with different working zones, to reduce cross-talk to within a selected tolerance. For example, instances of the first Moiré pattern 206 and the second Moiré pattern 210 may be separated by an exclusion zone 222 sufficiently large to mitigate cross-talk between the corresponding Moiré fringes to within a specified tolerance. In some embodiments, the exclusion zone 222 is in the range of 0.25 to 0.5 microns or greater.

The exclusion zone 222 may be empty or may be filled with sub-resolution assist features, which may be required by some design rules. In one embodiment, the exclusion zone 222 is filled with sub-resolution assist features oriented orthogonal to the measurement direction (the X direction here). In a general sense, as long as each working zone is rotationally symmetric, elements in each working zone (including Moiré patterns) may be placed in any 2D distribution suitable for mitigating cross-talk to within a selected tolerance.

Further, although FIG. 2A depicts working zones associated with measurements along a single direction (e.g., the X direction), the metrology target 202 targets and methods for measurement along additional directions (e.g., the Y direction) are within the spirit and scope of the present disclosure. The metrology target 202 may include a third working zone 224 and a fourth working zone 226 suitable for measurement along the Y direction. Further, the features in the third working zone 224 and/or the fourth working zone 226 may have any features suitable for overlay measurement and may, but are not required to, include one or more Moiré patterns. In another embodiment, though not shown, the metrology target 202 includes a working zone having a 2D Moiré pattern including periodic features in multiple directions (e.g., the X and Y directions). In this regard, the 2D Moiré pattern may exhibit Moiré fringes simultaneously along the multiple dimensions and may thus be suitable for simultaneous overlay measurements in multiple directions.

Figure 2C:
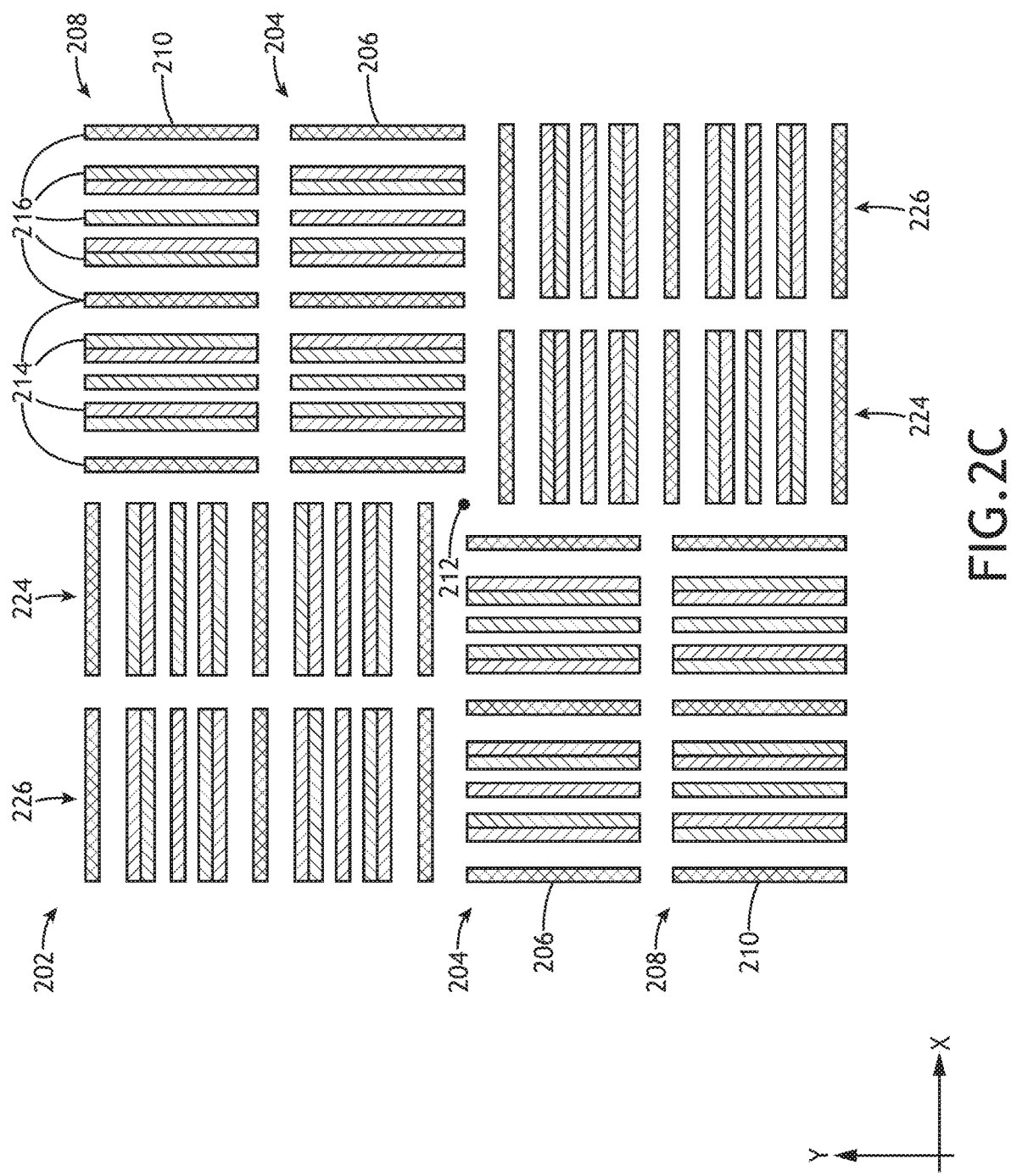
FIG. 2C is a top plan view of a metrology target based on FIGS. 2A and 2B for measurement along two orthogonal directions, in accordance with one or more embodiments of the present disclosure.

FIG. 2C is a top view of a metrology target 202 based on FIGS. 2A and 2B for measurement along two orthogonal directions, in accordance with one or more embodiments of the present disclosure. In particular, the metrology target 202 illustrated in FIG. 2C represents an example in which P=T and Q=S. Further, FIG. 2C illustrates a situation with no overlay error in either the X-direction or the Y-direction. In this regard, the axes of symmetry of the first working zone 204 and the second working zone 208 overlap along both the X and Y directions (e.g., the axes of symmetry of the first working zone 204 and the second working zone 208 overlap). However, it is to be understood that FIG. 2C and the associated descriptions are provided solely for illustrative purposes and should not be interpreted as limiting.

In one embodiment, the metrology target 202 includes a first working zone 204 with two instances of a first Moiré pattern 206 for measurement along the X direction, a second working zone 208 including two instances of a second Moiré pattern 210, a third working zone 224 with two instances of the first Moiré pattern 206 for measurement along the Y direction, and a fourth working zone 226 with two instances of the second Moiré pattern 210 for measurement along the vertical direction. In this regard, the third working zone 224 and the fourth working zone 226 are rotated versions of the first working zone 204 and the second working zone 208, respectively.

It is recognized herein that the Moiré gain depends on the particular layout of the metrology target 202. For example, the Moiré gain factor ($M_g$) associated with the metrology target 202 in FIG. 2A, where overlay is related to a shift of layer A with respect to layer B, may be characterized as:

$$M_g = M_1 - M_2 = \frac{P}{P-Q} - \frac{S}{S-T} = -\left(\frac{Q}{Q-P} - \frac{T}{T-S}\right). \quad (7)$$

Similarly, the Moiré gain factor associated with a shift of layer A with respect to layer B may be characterized as $-M_g = M_2 - M_1$.

As is evident by equation (7), the Moiré gain is impacted by the conditional Moiré factors associated with the first Moiré pattern 206 and the second Moiré pattern 210, which are in turn functions of the particular values of the grating pitches P, Q, S, and T. Accordingly, the values of the grating pitches P, Q, S, and T may be selected to increase or otherwise optimize the combined Moiré gain and thus the sensitivity to physical overlay errors. For example, the combined Moiré gain may generally be increased by selecting values of the grating pitches P, Q, S, and T such that the Moiré gains of the first working zone 204 and the second working zone 208 have different signs.

Figure 3:
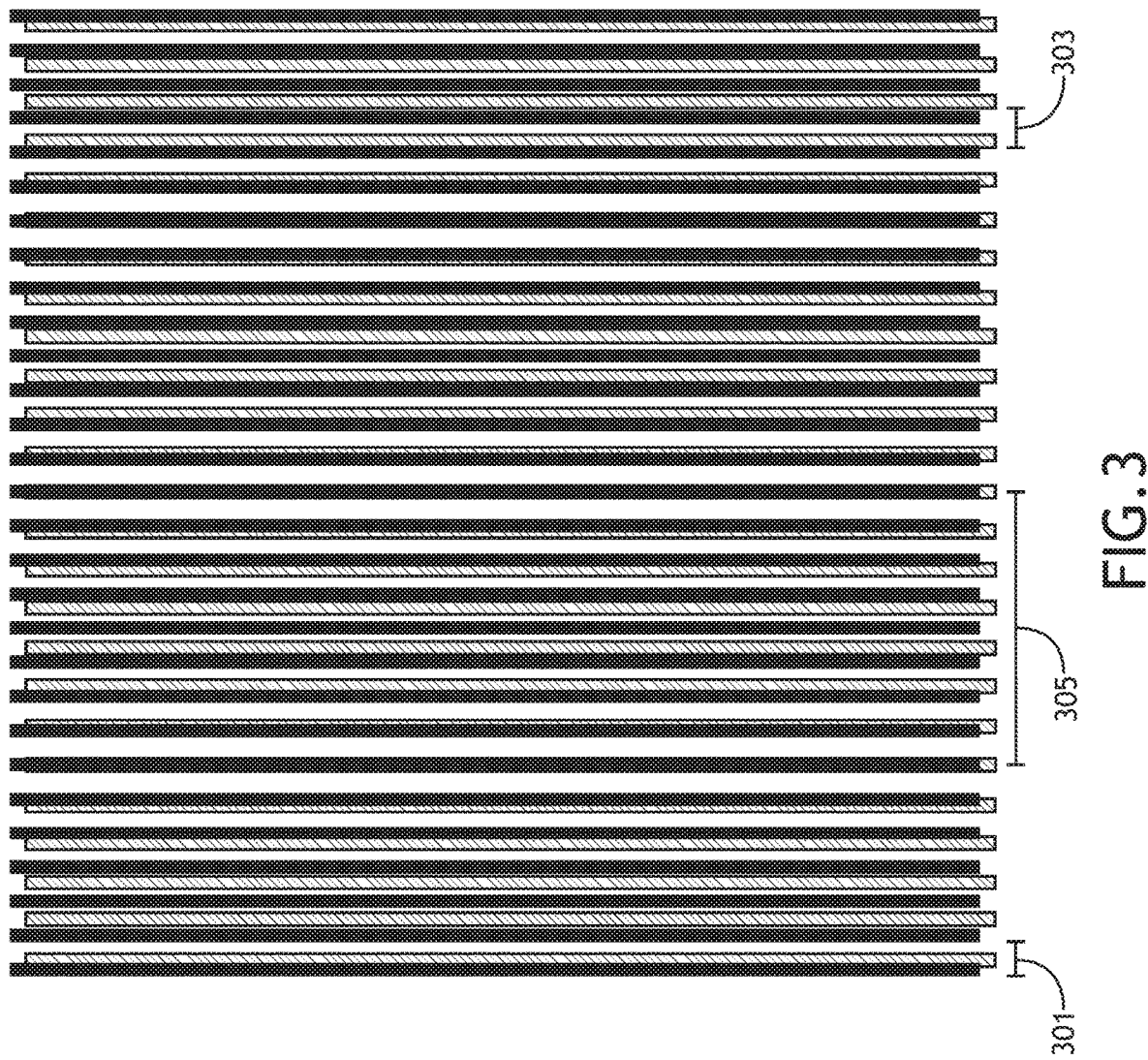
FIG. 3 illustrates an apparent Moiré period caused by the interference of two grating layers, in accordance with one or more embodiments of the present disclosure.

For additional clarification regarding the concept of a Moiré pattern, FIG. 3 illustrates an apparent Moiré period caused by the interference of two grating layers each having a different period. As shown, a first grating layer may have a period 301, a second grating layer may have a period 303, and an apparent Moiré pattern may have an apparent Moiré period 305 caused by the interference of the first and second grating layers.

Figure 4:
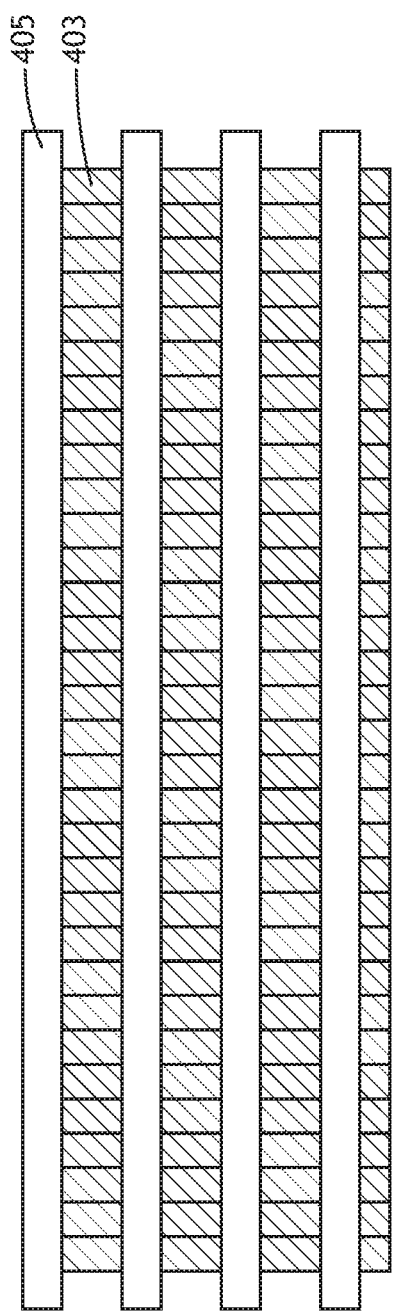
FIG. 4 illustrates a metrology target in which a Moiré pattern layer overlaps a device layer, in accordance with one or more embodiments of the present disclosure.

FIG. 4 illustrates an overlay metrology target in which at least one Moiré pattern layer 405 (e.g., a set of target features) overlaps at least one device layer 403 (e.g., a set of device features). The overlay metrology target of FIG. 4 may include any of the features of a metrology target 202 as described with respect to FIGS. 2A through 3 (e.g., grating structures, working zones, apparent Moiré patterns, etc.).

In some embodiments, the overlay metrology target may comprise a set of device features on a first layer 403 of a sample. At least a portion of the set of device features may be periodic with a device period. The set of device features may correspond to random access memory features (e.g., at least one of dynamic random access memory [DRAM] features or static random access memory [SRAM] features). The set of device features may comprise a replicated portion of a portion of a full set of device features on the first layer of the sample (e.g., the replicated portion may not be a functional device feature, and may be fabricated solely for overlay metrology measurement purposes). In other embodiments, the set of device features may comprise a portion of a full set of device features on the first layer of the sample (the portion of a full set of device features may be fully functional device features and not fabricated solely for measurement purposes).

In some embodiments, a first set of target features on a second layer 405 of the sample may overlap the set of device features. The first set of target features may be periodic with a first measurement period. The first measurement period may be selected to provide a first set of Moiré fringes visible by a detector when the target is imaged by the detector. The first set of target features may be substantially similar to, for example, the grating structures 214, 216, 218, and/or 220 as described with respect to FIG. 2B.

In some embodiments, a second set of target features on the second layer 405 of the sample may overlap the set of device features. The second set of target features may be periodic with a second measurement period. The second measurement period may be selected to provide a second set of Moiré fringes visible by the detector when the target is imaged by the detector. The second set of target features may be substantially similar to, for example, the grating structures 214, 216, 218, and/or 220 as described with respect to FIG. 2B.

In some embodiments, relative positions of the first set of Moiré fringes and the second set of Moiré fringes are indicative of overlay error between the first layer of the sample and the second layer of the sample. The overlay error may be determinable by dividing the relative positions of the first set of Moiré fringes and the second set of Moiré fringes by Moiré gain factors associated the device period, the first measurement period, and the second measurement period (see, e.g., the description with respect to FIGS. 2A-C). In some embodiments, the second measurement period may be different than the first measurement period, and the device period may be lower than a resolution of the detector.

In some embodiments, an overlay metrology system may comprise an illumination source (e.g., illumination source 106) to illuminate a sample (e.g., sample 102). The sample may include the overlay target as described with respect to FIG. 4. The overlay metrology system may further comprise a detector (e.g., detector 104) configured to image the overlay target when illuminated by the illumination source. The first measurement period may be selected to provide a first set of Moiré fringes visible by the detector when the target is imaged by the detector, and the second measurement period may be selected to provide a second set of Moiré fringes visible by the detector when the target is imaged by the detector.

The overlay metrology system may further comprise a controller communicatively coupled with the detector. The controller may include one or more processors configured to execute program instructions causing the one or more processors to (1) receive an image of the overlay target, (2) measure relative positions of the first Moire fringe and the second Moire fringe in the image as an apparent overlay error, and (3) determine an overlay error between the first layer of the sample and the second layer of the sample by adjusting the apparent overlay error by Moire gain factors associated with the device period, the first measurement period, and the second measurement period.

Figure 5:
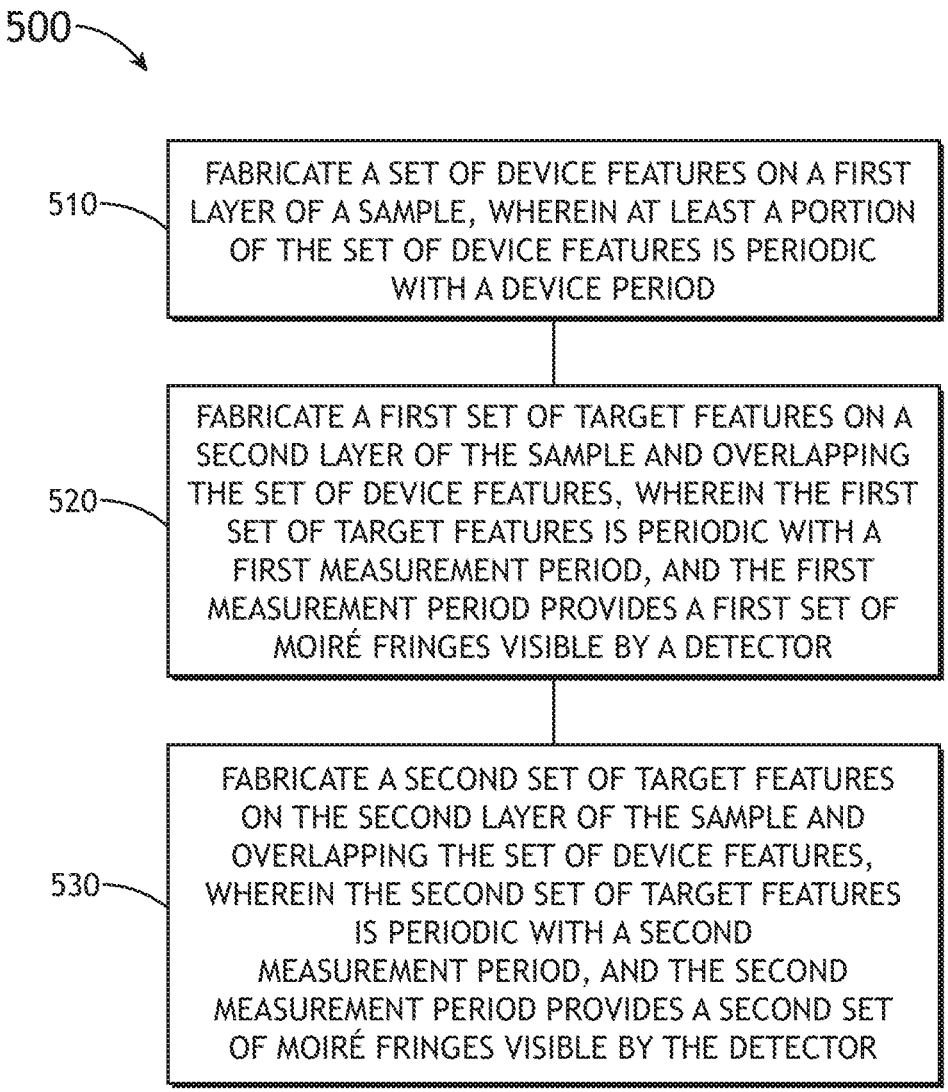
FIG. 5 is a flowchart illustrating a method of fabricating an overlay metrology target, in accordance with one or more embodiments of the present disclosure.

FIG. 5 is a flowchart 500 illustrating a method of fabricating an overlay metrology target.

At step 510, a set of device features may be fabricated on a first layer of a sample. At least a portion of the set of device features may be periodic with a device period. The set of device features may correspond to random access memory features (e.g., at least one of dynamic random access memory [DRAM] features or static random access memory [SRAM] features). The set of device features may comprise a replicated portion of a portion of a full set of device features on the first layer of the sample (e.g., the replicated portion may not be a functional device feature, and may be fabricated solely for overlay metrology measurement purposes). In other embodiments, the set of device features may comprise a portion of a full set of device features on the first layer of the sample (the portion of a full set of device features may be fully functional device features and not fabricated solely for measurement purposes).

At step 520, a first set of target features may be fabricated on a second layer of the sample and may overlap the set of device features. The first set of target features may be periodic with a first measurement period. The first measurement period may provide a first set of Moiré fringes visible by a detector. The first set of target features may be substantially similar to, for example, the grating structures 214, 216, 218, and/or 220 as described with respect to FIG. 2B.

At step 530, a second set of target features may be fabricated on the second layer of the sample and may overlap the first set of target features. The second set of target features may be periodic with a second measurement period. The second measurement period may provide a second set of Moiré fringes visible by the detector. The second set of target features may be substantially similar to, for example, the grating structures 214, 216, 218, and/or 220 as described with respect to FIG. 2B.

Figure 6:
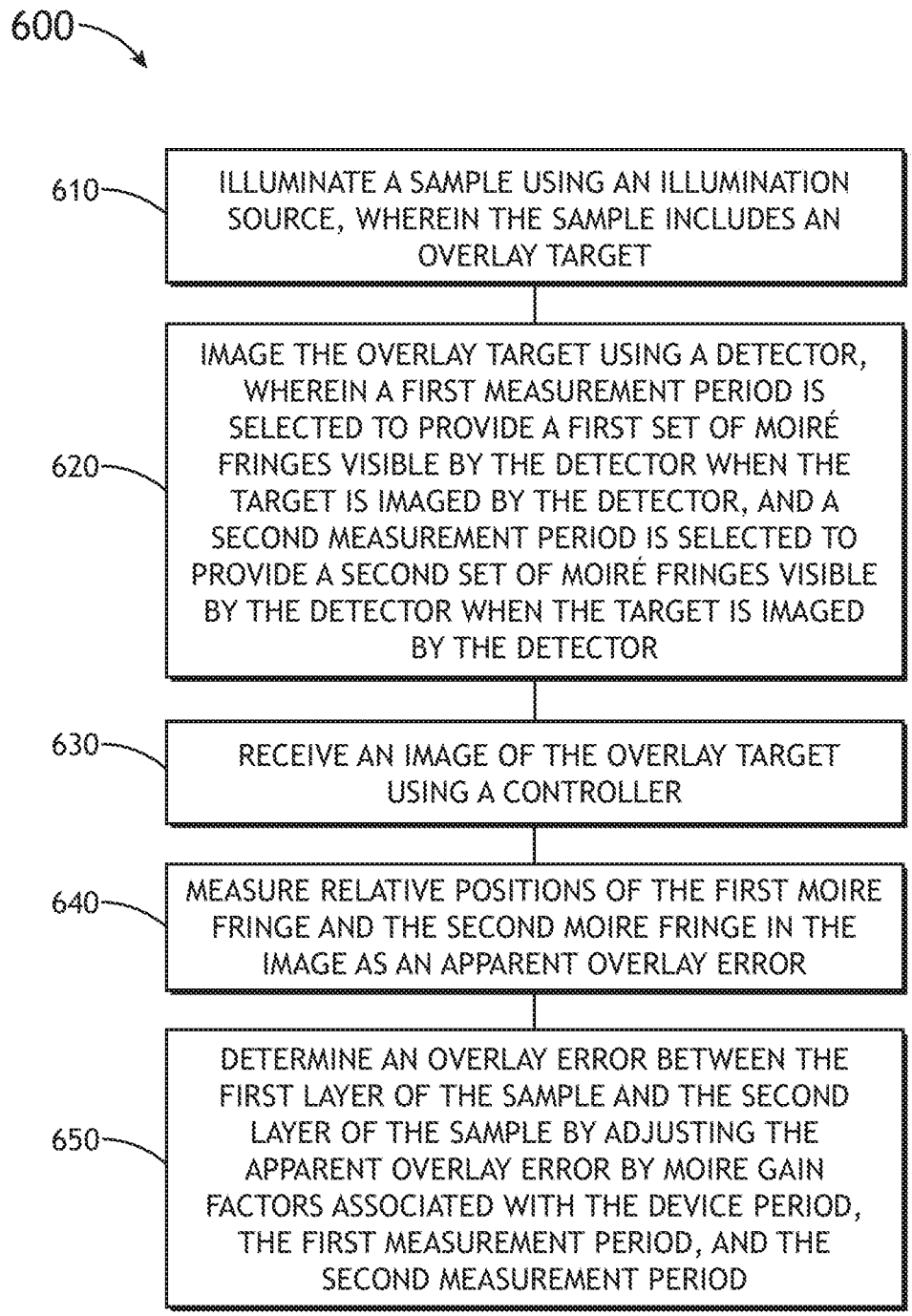
FIG. 6 is a flowchart illustrating a method of determining an overlay error, in accordance with one or more embodiments of the present disclosure.

FIG. 6 is a flowchart 600 illustrating a method of determining an overlay error.

At step 610, a sample (e.g., sample 102) may be illuminated using an illumination source (e.g., illumination source 106). The sample may include the overlay target as described with respect to FIG. 4. The overlay target may comprise a set of device features on a first layer of the sample. At least a portion of the set of device features may be periodic with a device period. The overlay target may further comprise a first set of target features on a second layer of the sample and overlapping the set of device features. The first set of target features may be periodic with a first measurement period. The overlay target may further comprise a second set of target features on the second layer of the sample and overlapping the set of device features. The second set of target features may be periodic with a second measurement period.

At step 620, a detector (e.g., detector 104) may image the overlay target when illuminated by the illumination source. The first measurement period may be selected to provide a first set of Moiré fringes visible by the detector when the target is imaged by the detector, and the second measurement period may be selected to provide a second set of Moiré fringes visible by the detector when the target is imaged by the detector.

At step 630, an image of the overlay target may be received by a controller (e.g., controller 130). The controller may be communicatively coupled with the detector. The controller may include one or more processors (e.g., processor 132) configured to execute program instructions (e.g., stored on memory 134) causing the one or more processors to perform the steps of determining an overlay error.

At step 640, relative positions of the first Moire fringe and the second Moire fringe in the image may be measured as an apparent overlay error.

At step 650, an overlay error may be determined between the first layer of the sample and the second layer of the sample by adjusting the apparent overlay error by Moire gain factors associated with the device period, the first measurement period, and the second measurement period.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology target comprising:
   a set of device features on a first layer of a sample, wherein at least a portion of the set of device features is periodic with a device period;
   a first set of target features on a second layer of the sample and overlapping the set of device features, wherein the first set of target features is periodic with a first measurement period, wherein the first measurement period is selected to provide a first set of Moiré fringes visible by a detector when the target is imaged by the detector; and
   a second set of target features on the second layer of the sample and overlapping the set of device features, wherein the second set of target features is periodic with a second measurement period, wherein the second measurement period is selected to provide a second set of Moiré fringes visible by the detector when the target is imaged by the detector, wherein relative positions of the first set of Moiré fringes and the second set of Moiré fringes are indicative of overlay error between the first layer of the sample and the second layer of the sample; and
   a second set of device features on a third layer of the sample, wherein at least a portion of the second set of device features is periodic with the device period;
   a third set of target features on a fourth layer of the sample and overlapping the second set of device features, wherein the third set of target features is periodic with a third measurement period, wherein the third measurement period is selected to provide a third set of Moiré fringes visible by the detector when the target is imaged by the detector; and
   a fourth set of target features on the fourth layer of the sample and overlapping the second set of device features, wherein the fourth set of target features is periodic with a fourth measurement period, wherein the fourth measurement period is selected to provide a fourth set of Moiré fringes visible by the detector when the target is imaged by the detector.

2. The overlay metrology target of claim 1, wherein the overlay error is determinable by dividing the relative positions of the first set of Moiré fringes and the second set of Moiré fringes by Moiré gain factors associated the device period, the first measurement period, and the second measurement period.

3. The overlay metrology target of claim 1, wherein the set of device features comprise:
   a replicated portion of a portion of a full set of device features on the first layer of the sample.

4. The overlay metrology target of claim 1, wherein the set of device features comprise:
   a portion of a full set of device features on the first layer of the sample.

5. The overlay metrology target of claim 1, wherein the second measurement period is different than the first measurement period.

6. The overlay metrology target of claim 1, wherein the device period is lower than a resolution of the detector.

7. The overlay metrology target of claim 1, wherein the set of device features correspond to random access memory features.

8. The overlay metrology target of claim 7, wherein the random access memory (RAM) features comprise:
   at least one of dynamic random access memory (DRAM) features or static random access memory (SRAM) features.

9. An overlay metrology system comprising:
   an illumination source to illuminate a sample, wherein the sample includes an overlay target comprising:
      a set of device features on a first layer of the sample, wherein at least a portion of the set of device features is periodic with a device period;
      a first set of target features on a second layer of the sample and overlapping the set of device features, wherein the first set of target features is periodic with a first measurement period; and
      a second set of target features on the second layer of the sample and overlapping the set of device features, wherein the second set of target features is periodic with a second measurement period;
      a second set of device features on a third layer of the sample, wherein at least a portion of the second set of device features is periodic with the device period;
      a third set of target features on a fourth layer of the sample and overlapping the second set of device features, wherein the third set of target features is periodic with a third measurement period, wherein the third measurement period is selected to provide a third set of Moiré fringes visible by the detector when the target is imaged by the detector; and
      a fourth set of target features on the fourth layer of the sample and overlapping the second set of device features, wherein the fourth set of target features is periodic with a fourth measurement period, wherein the fourth measurement period is selected to provide a fourth set of Moiré fringes visible by the detector when the target is imaged by the detector;
   a detector configured to image the overlay target when illuminated by the illumination source, wherein the first measurement period is selected to provide a first set of Moiré fringes visible by the detector when the target is imaged by the detector, and the second measurement period is selected to provide a second set of Moiré fringes visible by the detector when the target is imaged by the detector; and
   a controller communicatively coupled with the detector, the controller including one or more processors configured to execute program instructions causing the one or more processors to:
      receive an image of the overlay target;
      measure relative positions of the first Moiré fringe and the second Moiré fringe in the image as an apparent overlay error; and
      determine an overlay error between the first layer of the sample and the second layer of the sample by adjusting the apparent overlay error by Moiré gain factors associated with the device period, the first measurement period, and the second measurement period.

10. The overlay metrology system of claim 9, wherein the set of device features comprise:

a replicated portion of a portion of a full set of device features on the first layer of the sample.

11. The overlay metrology system of claim 9, wherein the set of device features comprise:
a portion of a full set of device features on the first layer of the sample.

12. The overlay metrology system of claim 9, wherein the second measurement period is different than the first measurement period.

13. The overlay metrology system of claim 9, wherein the device period is lower than a resolution of the detector.

14. The overlay metrology system of claim 9, wherein the set of device features correspond to random access memory features.

15. The overlay metrology system of claim 14, wherein the random access memory (RAM) features comprise:
at least one of dynamic random access memory (DRAM) features or static random access memory (SRAM) features.

16. An overlay metrology method comprising:
fabricating a set of device features on a first layer of a sample, wherein at least a portion of the set of device features is periodic with a device period;
fabricating a first set of target features on a second layer of the sample and overlapping the set of device features, wherein the first set of target features is periodic with a first measurement period, wherein the first measurement period is selected to provide a first set of Moiré fringes visible by a detector when the target is imaged by the detector; and
fabricating a second set of target features on the second layer of the sample and overlapping the set of device features, wherein the second set of target features is periodic with a second measurement period, wherein the second measurement period is selected to provide a second set of Moiré fringes visible by the detector when the target is imaged by the detector;
fabricating a second set of device features on a third layer of the sample, wherein at least a portion of the second set of device features is periodic with the device period;
fabricating a third set of target features on a fourth layer of the sample and overlapping the second set of device features, wherein the third set of target features is periodic with a third measurement period, wherein the third measurement period is selected to provide a third set of Moiré fringes visible by the detector when the target is imaged by the detector; and
fabricating a fourth set of target features on the fourth layer of the sample and overlapping the second set of device features, wherein the fourth set of target features is periodic with a fourth measurement period, wherein the fourth measurement period is selected to provide a fourth set of Moiré fringes visible by the detector when the target is imaged by the detector.

17. The overlay metrology method of claim 16, wherein the third measurement period is equal to the first measurement period.

18. The overlay metrology method of claim 17, wherein the fourth measurement period is equal to the second measurement period.

19. The overlay metrology method of claim 16, wherein the third measurement period is different than the first measurement period.

20. The overlay metrology method of claim 19, wherein the fourth measurement period is different than the second measurement period.

21. An overlay metrology method, comprising:
illuminating a sample using an illumination source, wherein the sample includes an overlay target comprising:
a set of device features on a first layer of the sample, wherein at least a portion of the set of device features is periodic with a device period;
a first set of target features on a second layer of the sample and overlapping the set of device features, wherein the first set of target features is periodic with a first measurement period; and
a second set of target features on the second layer of the sample and overlapping the set of device features, wherein the second set of target features is periodic with a second measurement period;
a second set of device features on a third layer of the sample, wherein at least a portion of the second set of device features is periodic with the device period;
a third set of target features on a fourth layer of the sample and overlapping the second set of device features, wherein the third set of target features is periodic with a third measurement period;
a fourth set of target features on the fourth layer of the sample and overlapping the second set of device features, wherein the fourth set of target features is periodic with a fourth measurement period;
imaging the overlay target using a detector, wherein the first measurement period is selected to provide a first set of Moiré fringes visible by the detector when the target is imaged by the detector, and the second measurement period is selected to provide a second set of Moiré fringes visible by the detector when the target is imaged by the detector, wherein the third measurement period is selected to provide a third set of Moiré fringes visible by the detector when the target is imaged by the detector, wherein the fourth measurement period is selected to provide a fourth set of Moiré fringes visible by the detector when the target is imaged by the detector; and
using a controller communicatively coupled with the detector for:
receiving an image of the overlay target;
measuring relative positions of the first Moiré fringe and the second Moiré fringe in the image as an apparent overlay error; and
determining an overlay error between the first layer of the sample and the second layer of the sample by adjusting the apparent overlay error by Moiré gain factors associated with the device period, the first measurement period, and the second measurement period.

* * * * *